United States Patent [19]

Rooney et al.

[11] Patent Number: 5,272,800
[45] Date of Patent: Dec. 28, 1993

[54] METHOD AND APPARATUS FOR FORMING AND POSITIONING A PREFORM ON A WORKPIECE

[75] Inventors: James F. Rooney, Bethany, Conn.; Won G. Park, Manteca, Calif.

[73] Assignee: Olin Corporation, Cheshire, Conn.

[21] Appl. No.: 724,259

[22] Filed: Jul. 1, 1991

[51] Int. Cl.$^5$ ............................................. B21D 39/00
[52] U.S. Cl. ....................................... 29/428; 29/759; 29/785; 264/153; 156/261; 156/520
[58] Field of Search .................. 29/759, 469.5, 792, 29/827, 785, 428; 264/153; 174/52.4; 156/261, 354, 517, 518, 520, 521

[56] References Cited

U.S. PATENT DOCUMENTS

| | | | |
|---|---|---|---|
| 4,214,944 | 7/1980 | Lemke | 156/518 |
| 4,897,508 | 1/1990 | Mahulikar et al. | 174/52.4 |
| 4,939,316 | 7/1990 | Mahulikar et al. | 174/52.4 |

Primary Examiner—Mark Rosenbaum
Assistant Examiner—S. Thomas Hughes
Attorney, Agent, or Firm—Bruce E. Burdick

[57] ABSTRACT

A method and apparatus for forming and attaching a preform to a metallic workpiece, particularly an epoxy preform for use in electronic packages. The epoxy preform is stamped from a strip and maintained in an upper die assembly. The metallic workpiece is indexed underneath the upper die assembly whereupon the epoxy preform is deposited onto the metallic workpiece and the metallic workpiece removed from underneath the upper die assembly.

18 Claims, 4 Drawing Sheets

METHOD AND APPARATUS FOR FORMING AND POSITIONING A PREFORM ON A WORKPIECE

BACKGROUND OF THE INVENTION

1. Field of the Invention

This invention relates generally to the formation of a preform and the attachment thereof to a metal workpiece; and, more particularly, this invention relates to the formation and attachment of an adhesive preform to a metal workpiece.

2. Background Information

The present invention has particular utility in attaching an adhesive layer to a metal workpiece which may used as a component for metal electronic packages. Such packages are shown and disclosed in U.S. Pat. No. 4,897,508.

In one form of a metal electronic package such as disclosed in the above-mentioned patent, the package comprises two parts, a base component and a cover or lid component. The base component is generally flat, without sidewalls, and a leadframe is spaced from the base component by a sealant such as an epoxy so it is in a plane which is in alignment with the upper surface or bonding face of the electronic device which is attached to the base member. The wire bonds connecting the bonding face of the metal package and the leadframe may flex upwardly so the upper component or lid of the package includes a cavity in its interior surface to provide the space for the flexing while minimizing overall thickness of the package. A sealant, such as an epoxy, is positioned between the upper surface of the leadframe and the cover or lid component.

In practice, it has been common for the epoxy sealant to be preformed and then positioned onto the cover or base member by hand. However, not only is a hand assembly slow, but also proper placement on the cover or lid is important so that excess adhesive is not squeezed out from the edges of the package or into the internal cavity of the package.

SUMMARY OF THE INVENTION

In accordance with the present invention, it is an object to provide an improved process and apparatus for forming a preform and attaching it to a component of a metal workpiece.

A more specific object of the present invention is the provision of an improved process and apparatus for forming an epoxy preform in the proper shape and attaching it to a metal workpiece in the proper location.

These and other objects and advantages of the present invention may be achieved through a process and apparatus which includes feeding a strip into a punch and die mechanism, cutting the desired shape from the strip to form a preform and holding it in an upper member and bringing the workpiece into a position below the preform and ejecting the preform from the upper member onto the workpiece.

This invention may be better understood by reference to the following description and the accompanying drawings in which:

DETAILED DESCRIPTION OF THE DRAWINGS

Figure 1:
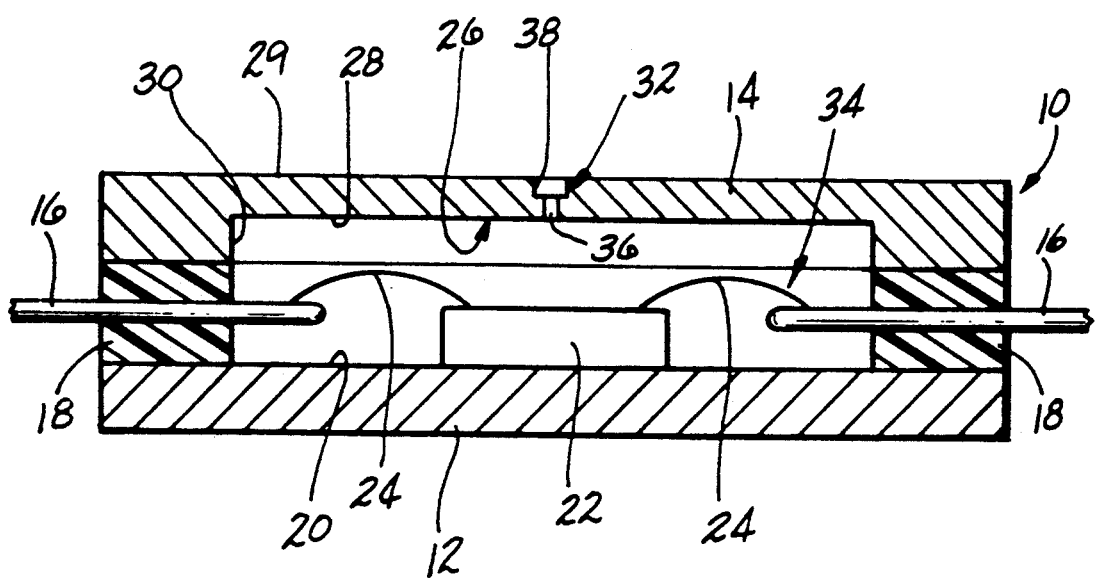
FIG. 1 is a cross-sectional view of an electronic package of the type which may utilize a metal workpiece having an epoxy sealant attached thereto in accordance with the present invention.

Referring to the drawings and in particular FIG. 1, an electronic package 10 is shown which includes components that may be made utilizing the process and apparatus of the present invention. The package 10 is comprised of a base component 12 and a cover or lid component 14. The base and cover components are formed from a ductile material such as a metal or metal alloy. Materials which may be used for these components include low coefficient of thermal expansion materials such as KOVAR and Alloy 42. Materials with higher coefficients of thermal expansion and high thermal conductivity to dissipate heat away from the electronic device such as copper, aluminum, and nickel near alloys are also preferred. One particularly preferred material is aluminum or aluminum alloy as described in U.S. Pat. No. 4,939,316. As mentioned in that patent, preferred aluminum alloys include those designated by the ASM (American Society for Metals) as 3xxx series. These alloys contain up to about 1.5% by weight manganese, along with other alloying ingredients. One especially preferred aluminum alloy is aluminum alloy 3003 having a nominal composition of about 0.12% by weight copper, about 1.5% by weight manganese and the balance aluminum.

A leadframe 16 is disposed between the base component 12 and cover component 14 and extends from the interior of the package to the outside thereof. The leadframe 16 is made from a conductive material having good tensile strength and typically is comprised of copper, iron or their alloys.

A sealant 18 bonds the leadframe 16 to the base component 12 and the cover component 14 and also bonds the base component 12 and cover component 14 together. The sealant 18 may be of a suitable polymer adhesive as is well known in the art. A resin adhesive such as an epoxy, for example ABLETRIK 550K manufactured by Abletrik Laboratories of Gardena, Calif., is one example.

The base component 12 may be generally flat and includes a planar internal surface 20. An electronic device 22, for example a semiconductor device, is bonded to the flat internal surface 20 of the base component 12 by a suitable die-attach means. Wire bonds 24 electrically connect the electronic device 22 to the inner portion of the leadframes 16.

The wire bonds 24 which electrically connect the leadframes 16 to the bonding sites on the surface of electronic device 22 may be formed from thin strips of copper foil by the process known as tape-automated bonding (TAB). These wire bonds 24 flex upwardly as shown in FIG. 1 and accordingly the upper cover or lid component 14 contains a cavity 26 having a bottom surface 28 parallel to the outside surface 29 and perpendicular sidewalls 30.

In some embodiments of metallic packages a vent hole 32 may be provided in the cover component 14 as described more fully in U.S. Pat. No. 4,897,508. The vent hole 32 is a vent for reaction by-products created during the cure cycle of the sealant. After the cure cycle is completed, an inert thermally conductive gas such as helium or thermally conductive, electronically non-conductive liquid may optionally be ejected into the package cavity 34 to provide additional thermal dissipation means for the electronic device 22. The vent hole may be in the form of a through bore 36 having a counterbore 38 extending inwardly from the outside surface of the cover as shown in FIG. 1. After the packaging is completed, the vent hole may be sealed by applying a suitable patch as, for example, a drop of solder into the counterbore 38 of vent hole.

The process and apparatus of the present invention may be used for attaching the sealant 18 to the base component 12 and the cover component 14 prior to the assembly thereof with the leadframe and electronic device. In the embodiment shown in FIG. 2, an apparatus 40 for forming the sealant preform shape and attaching it to either the base or cover component of the metal package is shown. Generally, the apparatus 40 comprises a punch and die assembly 41 including an upper die housing 42 and a lower die housing 44, and a transport mechanism 46 for moving a metal workpiece 48 such as the base 12 or cover 14 component of the metallic package of FIG. 1 to a position underneath the upper die housing 46. The sealant is fed into the apparatus in the form of an epoxy strip or tape 50.

More specifically, the apparatus 40 includes a base 52 upon which the lower die housing 44 is mounted. The lower die housing 44 includes a base block 54 attached to the base 52 by bolts 55 and having a hollow punch 56 extending upwardly therefrom which has a cross-sectional configuration corresponding to that of the epoxy preform 58 to be formed. A stripper plate 60 surrounds the outer periphery of the hollow punch 56 and is mounted for movement relative to the base block 54 and punch 56 by means of headed bolts 62 each having its head 64 mounted in a counterbore 66 in the base plate 54 and its opposite end 68 threadably attached to the stripper plate 60. A spring member 70 surrounds each of the bolts 62 to bias the stripper plate 60 upwardly to a position at which its top surface 72 is flush with the top surface 74 of the punch 56.

Two guideposts 76 are mounted in the base 52 and extend upwardly through ears 78 in the base block 54 of the lower die housing 44. The upper die housing 42 is mounted for movement toward and away from the lower die housing 44 on the guideposts 76 and is biased into its raised portion by springs 77 surrounding each of the guideposts 76 and extending between the upper and lower die housings 42 and 44 as shown. The upper die housing 44 includes an upper base plate 80 having ears 82 with openings 84 through which the guideposts 76 extend whereby the upper die housing 42 is guided for vertical movement. A backing plate 86 is positioned flush against the bottom surface 88 of the upper base plate 80. A die member 90 has its upper surface positioned against the backing plate 86. The backing plate 86 and die member 90 are securely attached to the upper base plate 80 by means of alignment pins 92 and threaded bolts 94 as shown.

An ejector piston 96 is mounted in an opening 98 extending through the upper base plate 80 and includes a body portion 100 guided for movement within the opening 98 and a post 102 extending upwardly from the body portion 100 above the top surface 104 of the upper base plate 80. Ejector pins 106 are slidably mounted for axial movement in the backing plate 86 and extend upwardly through the backing plate 86 into the opening 98 beneath the ejector piston 96.

A center post 108, having a cross-section corresponding to the cross-section of the hollow opening in the punch 56 of the lower die housing 44, and thus, also corresponding to the internal opening in the epoxy preform, extends downwardly from the backing plate 86 through an opening 110 in the die member 90. The opening 110 is defined by a surface having a shape conforming to the outer periphery of the epoxy preform.

An ejector member 112 having a bottom portion 114 conforming to the shape of the epoxy preform and an upper outwardly extending flange portion 116 is mounted in the die member 90. The bottom portion is positioned between the opening 110 and post 108. The flange portion 116 of the ejector member 112 is positioned within a counterbore 118 in the upper surface of the die member 90 with the bottom portion 114 extending into the opening 110 in the die member 90. The depth of the counterbore 118 is greater than the thickness of the flange portion 116 of the ejector member 112 such that there is a space provided between the flange 116 and the bottom of counterbore 118 when the ejector member 112 is in its upper position whereby the ejector member 112 has limited axial movement in a vertical direction with respect to the die member 90. When the ejector member 112 is in the upper position, the bottom surface 120 of the ejector member 112 is recessed within the die member 90 forming a cavity 122 therein having the shape of the epoxy preform to be stamped out of the strip 50.

The transport mechanism 46 is mounted on the base 52 and includes an elongated rectangular transport member 130 adapted to be reciprocated into and out from underneath the upper die housing 42. The transport member 130 has its outer end portion 132 guided by spaced inverted L-shaped brackets 134 mounted on spaced support block 136 as shown. The inner end 138 of the transport member 130 rests on blocks 140 and 142 mounted on the base block 54. When the transport member 130 is in its inner position underneath the upper die housing 42, the inner end 138 rests on both of the spaced blocks 140 and 142. When it is in the withdrawn position, the inner end 138 rests solely on the outer block 140.

A metal workpiece receiving cavity 150 is provided in the inner end 138 of the transport member 130 and opens to the upper side thereof. The metal workpiece 48 to which the epoxy preform is to be attached is contained within the cavity 150 for movement with the transport member 130. The transport member 130 is provided with a series of alignment holes 152 outwardly of metal workpiece receiving cavity 150 through which alignment pins 154 which extend downwardly from the upper die assembly 42 are adapted to extend when the transport member 130 is in its inward position and when the upper die assembly 42 is moved into its lower position.

The upper die assembly 42 may be raised and lowered by means of a suitable air cylinder 156. Similarly, an air cylinder 158 may be attached to the ejection ram for actuation thereof. The slide assembly may also be reciprocated between its inner and outer positions by means of the air cylinder 160. The air cylinders 136, 138 and 140 may all connect to suitable timing valves (not shown) to activate the mechanisms in the proper sequence to be described below. Other suitable moving members such as air motors, electric motors or the like may be used. Alternatively, handles may be provided for the manual operation of the device.

In operation, with the transport member 130 withdrawn, the strip 50 of epoxy sealant is indexed onto the lower die housing 44 beneath the upper die housing 42 by hand or by suitable indexing mechanism. The air cylinder 156 lowers the upper die housing 42 so that the bottom surface of the die member and post 108 in the upper die housing 42 engage and force the strip 50 against the stripper plate 60 and punch 56 in the lower die housing 44. Continual downward movement of the upper die housing 42 causes the stripper plate 60 and epoxy strip 50 to move downwardly relative to the punch 56 thereby cutting out the preform from the strip. The cut preform is forced into the cavity 122 in the bottom surface of the upper die housing 42 so that the preform is retained within the cavity 122 as the upper die housing 42 is moved upwardly. The stripper plate 60 strips the epoxy strip 50 from the punch 56 as the upper die housing 42 is raised.

When the upper die housing 42 is raised, the transport member 130 with a suitable metal workpiece positioned within the receiving cavity 150 is indexed beneath the upper die housing 42 and over the lower die housing 44 and epoxy strip 50, and the upper die housing 42 is again lowered. When the upper die housing 42 reaches its lower position with its lower surface against the surface of the transport member 130, the ejector piston 106 is lowered transmitting motion by means of the pins to the ejector member 112 which ejects the epoxy preform onto the top surface of the metal workpiece 48. When the upper die housing 42 is raised, the transport member 130 is moved out from underneath the upper die housing 42 and the metal workpiece with the epoxy preform attached thereto is removed from the cavity 150 either by hand, a pick-and-place mechanism, or other suitable mechanism and a new workpiece placed therein and the cycle repeated.

Figure 4:
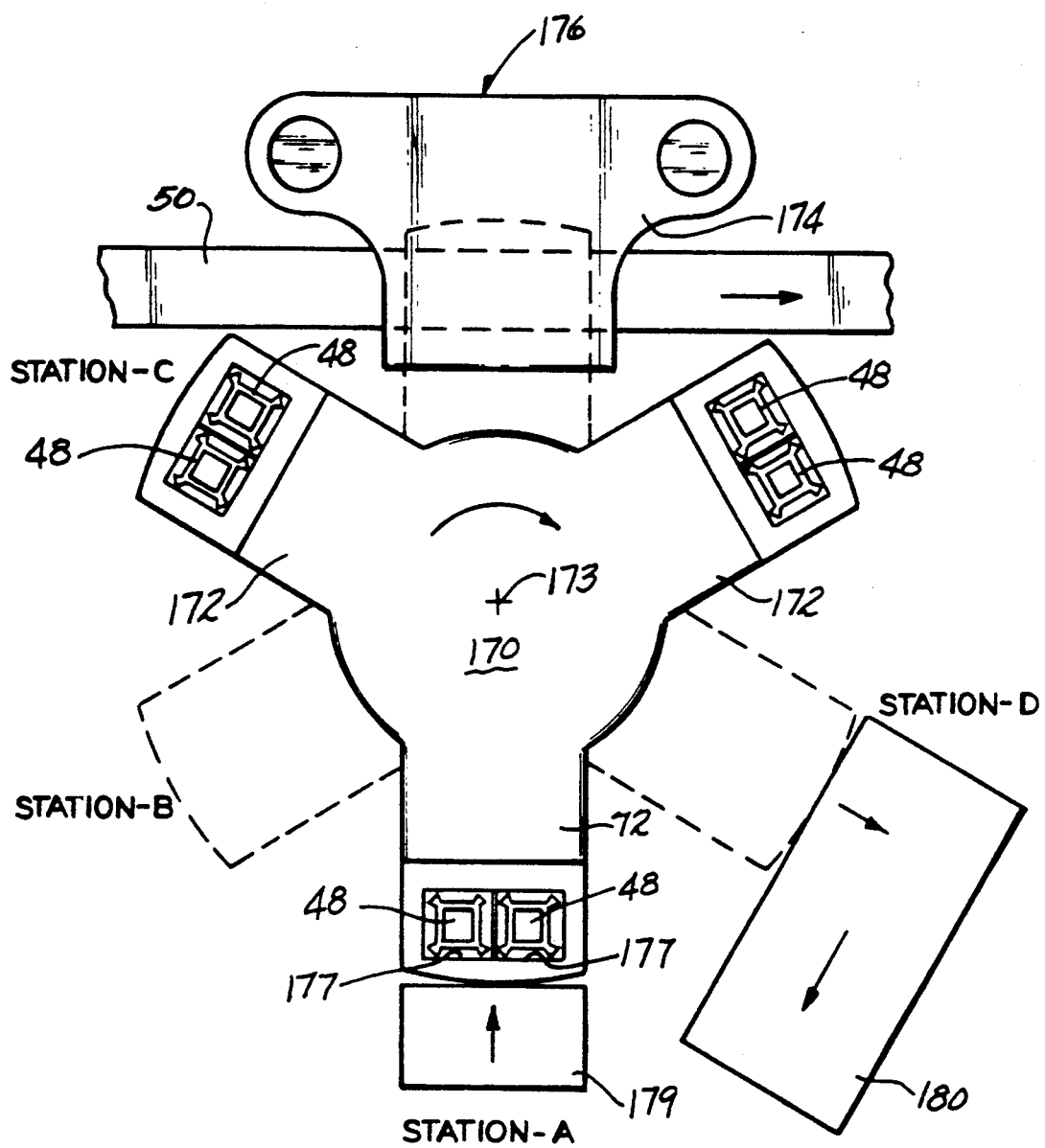
FIG. 4 is a schematic plan view of a second embodiment of the present invention.

In the embodiment shown in FIG. 4, instead of a transport member that reciprocates inwardly and outwardly to feed the workpiece 48 underneath the upper die housing 42, a rotatable table member 170 having three arms 172 is provided which is rotatable about a center axis 173. Multiple cavities 174 for receiving the metal workpiece are provided in each arm 172. In the particular case shown in FIG. 2, there are two such cavities 177 spaced in side-by-side relationship. In the case of this embodiment, the upper 174 and lower die housing of the punch and die assembly 176 are similar to those of FIG. 2 except that they are provided with means for simultaneously forming two epoxy preforms and then ejecting them. Thus, the upper die housing 174 will contain two cavities and two ejectors and the lower die housing will contain two punches each mating with a respective cavity in the upper die housing.

The table 170 is rotatably indexed (by suitable means not shown) from a position where two of the arms 172 are spaced on either side of the upper and lower die housings of the punch and die assembly 176 such that the upper die housing 174 can be moved downwardly to punch the preforms from the epoxy strip 50 positioned against the lower die housing. The third arm 172 extends radially outward from the punch and die assembly 176 and is positioned at Station A where the metal workpiece 48 are loaded into suitable cavities 177 in the of the outer portions of the arm 172. A cover-type stocker or other suitable mechanism 179 may be utilized to load the workpieces.

Figure 2:
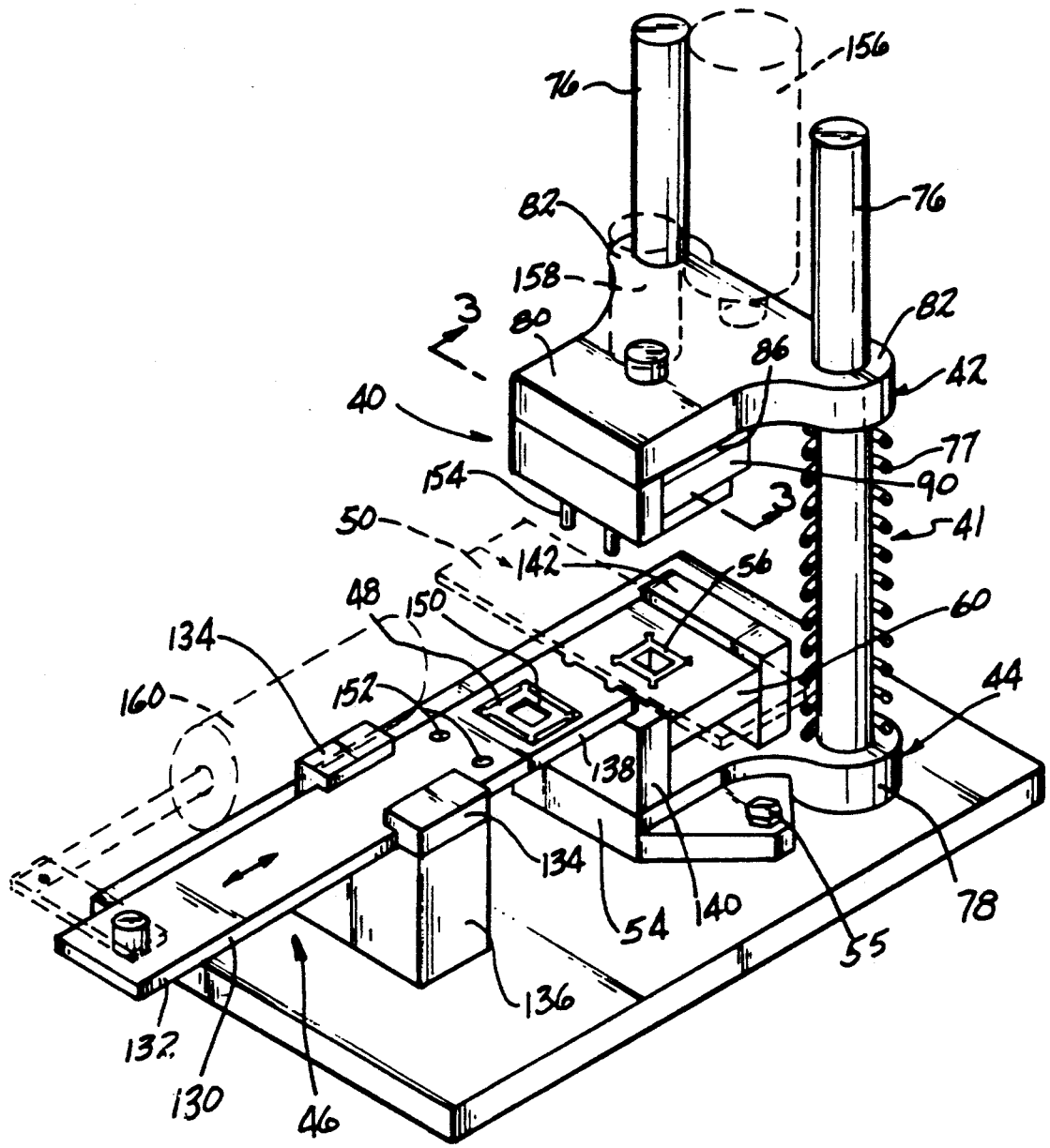
FIG. 2 is an isometric view of a first embodiment of the present invention.
Figure 3:
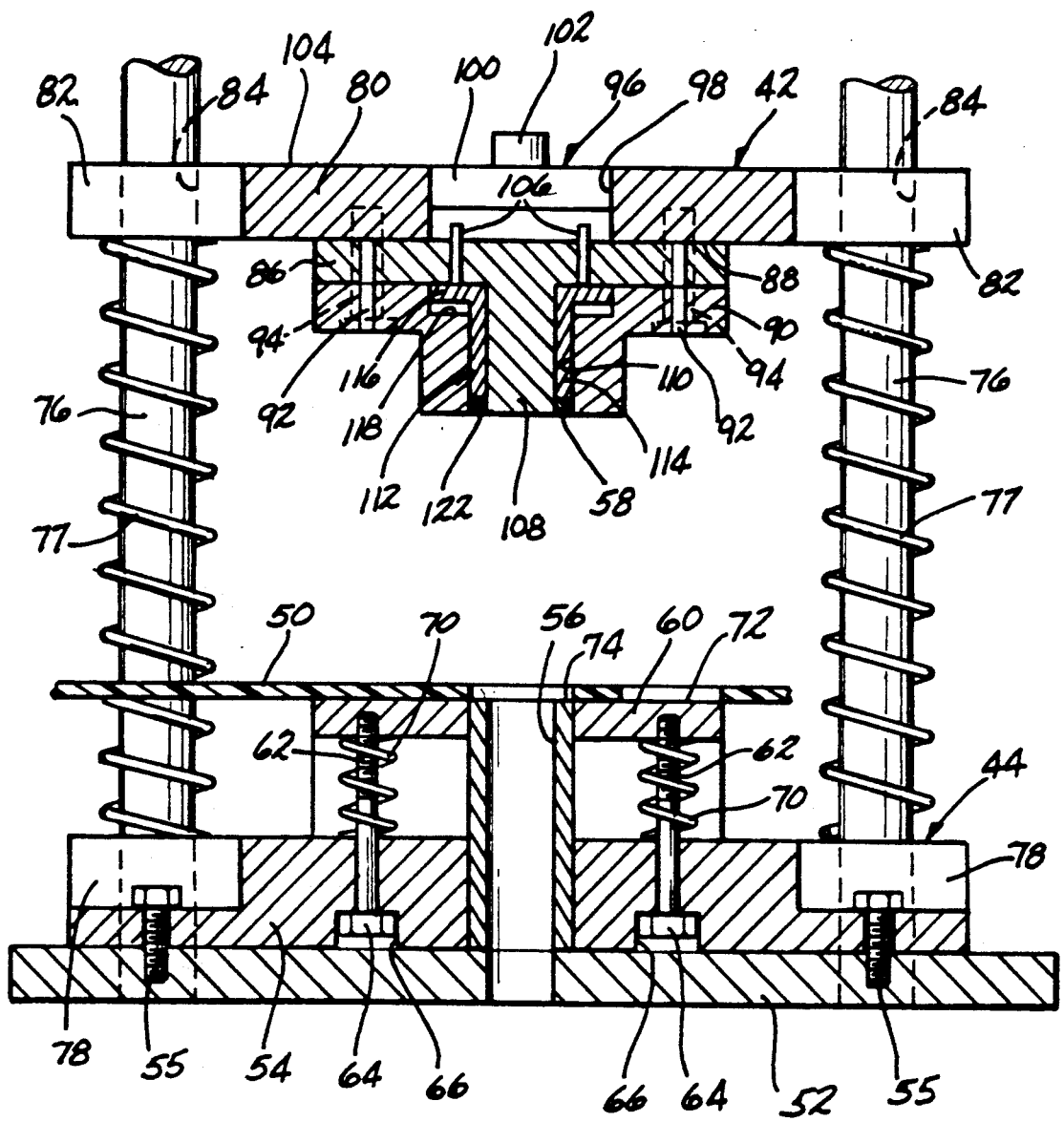
FIG. 3 is a sectional view of an embodiment shown in FIG. 2 taken along the lines 3—3 of FIG. 2.

As in the first embodiment, the epoxy preform, after being stamped from the strip 50, is maintained in a cavity in the upper die housing 174 as it is raised upwardly at which point the table is indexed such that an arm 172 containing a metal workpiece 48 is positioned underneath the upper die housing 174 so that the epoxy preform is deposited on the metal workpiece 48 upon the next downward movement of the upper die housing 174 and the actuation of the ejector member in a manner similar to that explained in connection with the embodiment of FIG. 2.

With the arrangement shown in FIG. 4, it is possible to preheat the metal workpieces at Stations B and C by a suitable heater prior to their being positioned underneath the die assembly and the epoxy preform positioned thereon. After the preforms are deposited on the workpiece, the table 170 is then indexed again, moving the arm having the workpieces 50 with the epoxy preforms thereon to a position to the side of the upper and lower die housing 174 and 176 whereupon the strip 50 may be indexed and the upper die housing lowered to form a new preform. Upon the next indexing, the arm 172 with the workpiece 48 having the preforms thereon are moved to Station D where they may be removed by a suitable mechanism, such as a pick-and-place mechanism 180 while new preforms are being deposited on the workpiece in the arm 172 positioned underneath the upper die assembly 174.

While the invention has been described above with reference to specified embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. An apparatus for forming and positioning a preform on a workpiece comprising:
   a) first and second die housings having relative movement toward and away from each other for forming a preform from a strip upon movement of said first and second die housings toward each other and maintaining the preform in the first die housing as the first die housing is moved away from the second die housing,
   b) a transport means for moving a workpiece into a preform receiving position between the first and second die housings after a preform has been formed, and
   c) means for transferring said preform in said first die housing onto said workpiece when said transport means has moved said workpiece into said preform receiving position.

2. The apparatus of claim 1 wherein one of said die housings contains a punch for stamping said preform from said strip and one of said die housings contains a cavity for receiving the stamped preform.

3. The apparatus of claim 2 further including an ejector member mounted in the cavity-containing die housing and actuatable when the workpiece is positioned in the preform receiving position and the cavity-containing die housing is moved toward the other die housing to eject a preform from said cavity against said workpiece.

4. The apparatus of claim 1 wherein said means for transporting said workpiece includes a transfer member having a cavity therein for receiving a workpiece and reciprocal into and out of the preform receiving position between the first and second die housings.

5. The apparatus of claim 1 wherein said means for transporting said workpiece includes a rotatable member having a plurality of arms extending radially outwardly from an axis of rotation thereof, at least one workpiece receiving cavity in each of said arms adjacent an outer end thereof, said rotatable member being rotatable from a position wherein said arms are positioned remote from said first die housing to a position wherein one of said arms is positioned such that the cavity is positioned between the first and second die housings.

6. The apparatus of claim 1 wherein said preform is an epoxy adhesive and said workpice is metallic.

7. The apparatus of claim 5 wherein there are a plurality of workpiece receiving cavities in each arm.

8. A process for forming and positioning a preform onto a workpiece comprising:
    forming a preform from a strip by punching said preform from said strip by movement of a first die housing toward a second die housing,
    maintaining said cut preform in said first die housing as said first die housing is moved relatively away from said second die housing,
    moving a workpiece into a preform receiving position between said first and second die housings after said preform has been formed, and
    transferring said preform onto said workpiece when said workpiece is in the preform receiving position between the first and second die housings.

9. The process of claim 8 wherein said preform is an epoxy adhesive and said workpiece is metallic.

10. The process of claim 8 wherein said first die housing is disposed above the second die housing during the formation of the preform and during the transfer of the preform onto the workpiece.

11. The process of claim 8 wherein said moving step comprises rotating said workpiece about an axis spaced from said workpiece into and out of its preform receiving position between the first and second die housings.

12. The process of claim 8 wherein said forming step comprises simultaneously forming a plurality of preforms, and said transferring step comprises simultaneously transferring a plurality of preforms onto said workpiece.

13. The process of claim 8 wherein the transferring step further comprises transferring the preform onto the workpiece when the workpiece is in a preform receiving position between the strip and the first die housing.

14. The process of claim 8 wherein the transferring step further comprises transferring the preform onto the workpiece while a transport mechanism used to move the workpiece during the moving step rests on one of the die housings.

15. The process of claim 14 wherein the process is performed entirely while the first die housing is positioned above the second die housing.

16. The process of claim 15 wherein the moving step further comprises reciprocating the transport mechanism between a workpiece receiving/ejection position and the preform receiving position.

17. The process of claim 15 wherein the moving step comprises rotating the transport mechanism between a workpiece receiving position and the preform receiving position.

18. The process of claim 15 wherein the moving step comprises rotating the transport mechanism between a first workpiece receiving position, the preform receiving position and a third workpiece/preform ejection position.

* * * * *